(12) United States Patent
Wei et al.

(10) Patent No.: US 9,772,533 B2
(45) Date of Patent: Sep. 26, 2017

(54) METHOD AND DEVICE FOR REPAIRING METAL WIRE

(71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Pingyu Wei, Beijing (CN); Lei Han, Beijing (CN); Dong Guo, Beijing (CN); Tao Wu, Beijing (CN)

(73) Assignees: BOE TECHNOLOGY GROUP CO., LTD. (CN); HEFEI XINSHENG OPTOELECTRONICS TECHNOLOGY CO., LTD. (CN)

( * ) Notice: Subject to any disclaimer, the term of this patent is extended or adjusted under 35 U.S.C. 154(b) by 56 days.

(21) Appl. No.: 14/888,643

(22) PCT Filed: May 12, 2015

(86) PCT No.: PCT/CN2015/078739
§ 371 (c)(1),
(2) Date: Nov. 2, 2015

(87) PCT Pub. No.: WO2016/086603
PCT Pub. Date: Jun. 9, 2016

(65) Prior Publication Data
US 2016/0342054 A1 Nov. 24, 2016

(30) Foreign Application Priority Data

Dec. 5, 2014 (CN) .......................... 2014 1 0736692

(51) Int. Cl.
*G02F 1/1362* (2006.01)
*G02F 1/13* (2006.01)

(52) U.S. Cl.
CPC ...... *G02F 1/136259* (2013.01); *G02F 1/1309* (2013.01); *G02F 2001/136263* (2013.01)

(58) Field of Classification Search
CPC ............. G02F 1/136259; G02F 1/1309; G02F 2001/136263; G02F 1/1303; G02F 1/1306;
(Continued)

(56) References Cited

U.S. PATENT DOCUMENTS 5,164,565 A * 11/1992 Addiego .............. B23K 26/032
219/121.6
5,175,504 A * 12/1992 Henley .................. G09G 3/006
219/121.68
(Continued)

FOREIGN PATENT DOCUMENTS

CN 1782826 A 6/2006
CN 101178489 A 5/2008
(Continued)

OTHER PUBLICATIONS

First Office Action for Chinese Application No. 201410736692.6, dated Feb. 16, 2017, 8 Pages.
(Continued)

*Primary Examiner* — Joseph L Williams
*Assistant Examiner* — Jose M Diaz
(74) *Attorney, Agent, or Firm* — Brooks Kushman P.C.

(57) ABSTRACT

The present disclosure provides a method and a device for repairing a metal wire. The method includes: locating a first position on the metal wire to be repaired, the first position being at a first side of a break point on the metal wire to be repaired; and outputting a first laser beam in such a manner as to move from the first position toward the break point and scan a portion of the metal wire between the first position and the break point, so as to fuse the portion of the metal
(Continued)

wire and enable fused metal to flow toward the break point to fill the break point.

18 Claims, 6 Drawing Sheets

(58) Field of Classification Search
CPC .. H01L 2251/568; H02K 3/225; H02K 3/222; H02K 3/288; H02K 3/4685; H02K 1/0292; H01R 43/00; H01R 43/02; H01R 43/0221; H01R 43/0228; H01R 43/0256
See application file for complete search history.

(56) References Cited

U.S. PATENT DOCUMENTS

| | | | | |
|---|---|---|---|---|
| 6,313,815 | B1* | 11/2001 | Takeda | G09G 3/006 313/309 |
| 8,421,793 | B2* | 4/2013 | Chen | G02F 1/136259 345/214 |
| 9,035,673 | B2* | 5/2015 | Young | G01R 31/2853 324/762.01 |
| 2004/0239364 | A1* | 12/2004 | Chung | G02F 1/136259 324/754.03 |
| 2006/0065645 | A1* | 3/2006 | Nakasu | B23K 26/34 219/121.68 |
| 2007/0063951 | A1* | 3/2007 | Lin | G09G 3/3611 345/93 |
| 2007/0262351 | A1* | 11/2007 | Liu | G02F 1/136259 257/209 |
| 2009/0223940 | A1* | 9/2009 | Hosoya | B23K 15/008 219/121.64 |
| 2010/0224601 | A1* | 9/2010 | Sugaya | H01R 13/6666 219/121.64 |
| 2010/0270275 | A1* | 10/2010 | Nakamae | B23K 26/009 219/121.64 |
| 2011/0139753 | A1 | 6/2011 | Lee et al. | |
| 2012/0237787 | A1* | 9/2012 | Yoshida | H01R 43/0221 428/615 |
| 2015/0360319 | A1* | 12/2015 | Yagi | B23K 26/262 219/121.64 |
| 2015/0364531 | A1* | 12/2015 | Kim | H01L 27/3276 257/40 |
| 2016/0342054 | A1 | 11/2016 | Wei et al. | |
| 2017/0017131 | A1* | 1/2017 | Aoki | G02F 1/136259 |

FOREIGN PATENT DOCUMENTS

| | | |
|---|---|---|
| CN | 101471272 A | 7/2009 |
| CN | 102126084 A | 7/2011 |
| CN | 102368478 A | 3/2012 |
| CN | 203782232 U | 8/2014 |
| CN | 204215119 U | 3/2015 |
| CN | 104570415 A | 4/2015 |
| DE | 19542554 A1 | 5/1997 |
| JP | H01233084 A | 9/1989 |
| JP | H03176919 A | 7/1991 |
| JP | H10244367 A | 9/1998 |
| JP | H11121906 A | 4/1999 |
| KR | 0156201 B1 | 11/1998 |

OTHER PUBLICATIONS

International Search Report and Written Opinion for Application No. PCT/CN2015/078739, dated Aug. 20, 2015, 12 Pages.

* cited by examiner

-Related art-

Fig. 1a

-Related art-

METHOD AND DEVICE FOR REPAIRING METAL WIRE

CROSS-REFERENCE TO RELATED APPLICATION

The present disclosure is the U.S. national phase of PCT Application No. PCT/CN2015/078739 filed on May 12, 2015, which claims a priority of the Chinese patent application No. 201410736692.6 filed on Dec. 5, 2014, which is incorporated herein by reference in its entirety.

TECHNICAL FIELD

The present disclosure relates to the field of display device manufacturing technology, in particular to a method and a device for repairing metal wires.

BACKGROUND

During the cell formation of a display panel of a liquid crystal display device, a liquid crystal substrate is segmented into several liquid crystal panels with different sizes, and then the liquid crystal panels are subjected to lighting detection so as to detect deficiencies. Among them, an electrical deficiency, as a most frequently occurring deficiency, mainly includes spots, broken circuits (of a data line, a gate line and a common line), short circuits (of any two of the data line, the gate line and the common line), X-axis bright/dark line, Y-axis bright/dark line, and so on.

There mainly exist two kinds of broken circuits. One includes a broken metal wire at a display region of the liquid crystal panel, and during the lighting detection, this kind of broken circuit is represented by bright or dark lines that do not extend throughout a screen. The other includes a broken metal wire (a data line terminal or a gate line terminal) at a terminal region, and during the lighting detection, this kind of broken circuit is represented by bright or dark lines that extend throughout the screen.

Figure 1A:
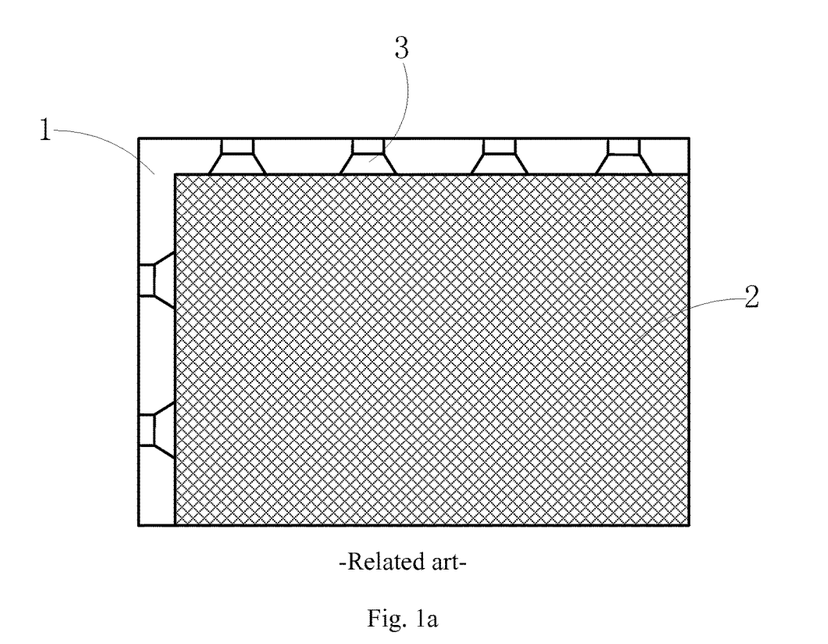
FIG. 1a is a schematic view showing a terminal region of an existing liquid crystal panel.
Figure 1B:
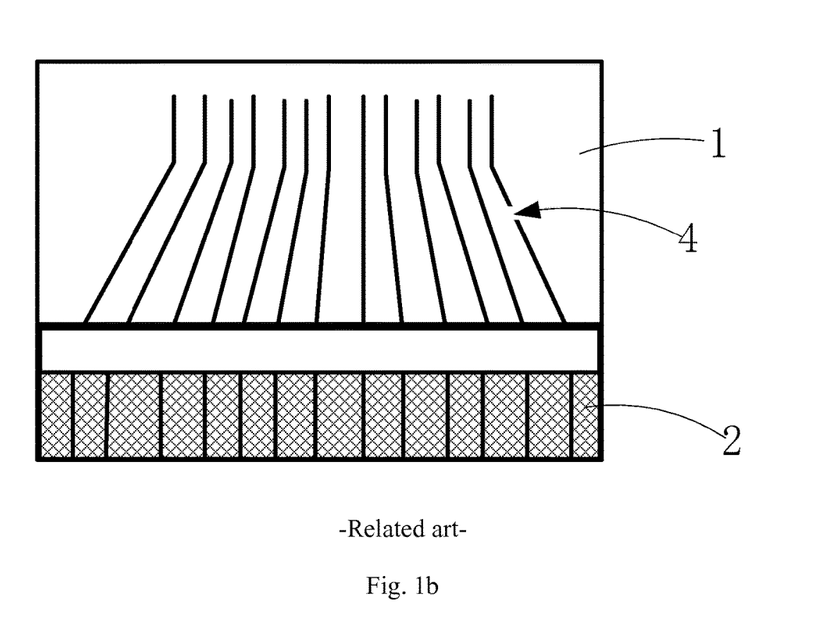

FIG. 1a is a schematic view showing the terminal region of the existing liquid crystal panel, and FIG. 1b is an exploded view of the terminal region. The liquid crystal panel includes an array substrate 1 and a color filter substrate 2 arranged opposite to each other. Usually, the array substrate 1 is of a size greater than the color filter substrate 2, so the array substrate 1 may extend beyond the color filter substrate 2 as shown in FIGS. 1a and 1b. The terminal region 3 is just arranged at a portion of the array substrate 1 beyond the color filter substrate 2, and exposed to the outside. The terminal region 3 is a region where the terminals of the metal lines, e.g., the data lines or gate lines, are located, and usually it is arranged at left and upper sides of the liquid crystal panel. To be specific, the gate line terminals are arranged at the left side, while the data line terminals are arranged at the upper side.

Figure 4A:
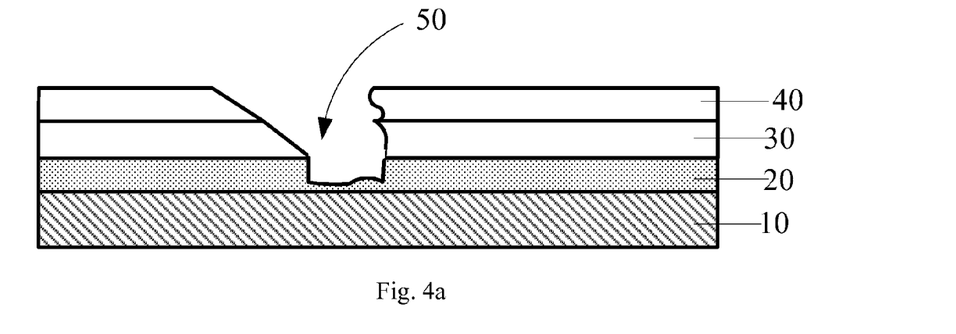
FIGS. 4a-4f are yet another flow chart of the method for repairing a metal wire according to the third embodiment of the present disclosure.

Currently, the broken metal wire at the display region of the liquid crystal panel may be repaired in two methods. One includes outputting a dedicated repairing line on the liquid crystal panel so as to repair the broken metal line, and the other includes outputting a specific pixel so as to repair the broken metal line using lines in the pixel. However, when the broken meal wire occurs at the terminal region 3, it is impossible to repair the metal wire by means of the dedicated repairing line. In addition, there is no pixel or any other line surrounding the broken metal wire 4 at the terminal region (as shown in FIG. 4), it is impossible to repair the broken metal wire by means of the other line either. During the actual manufacture, the terminal region is exposed to the outside, so the metal wire at the terminal region is easily broken, especially during the cutting. The metal wire may usually be scratched by glass fragments, and the bright/dark lines and thereby a detection result "not good (NG)" may occur. Hence, there is an urgent need to provide a method for repairing the broken metal line at the terminal region, so as to improve the yield.

SUMMARY

An object of the present disclosure is to provide a method and a device for repairing a metal wire, so as to repair the broken metal wire at a terminal region of a display panel.

In one aspect, the present disclosure provides in one embodiment a method for repairing a meal wire, including steps of: locating a first position on the metal wire to be repaired, the first position being at a first side of a break point on the metal wire to be repaired; and outputting a first laser beam in such a manner as to move from the first position toward the break point and scan a portion of the metal wire between the first position and the break point, so as to fuse the portion of the metal wire and enable fused metal to flow toward the break point, thereby to fill the break point with the fused metal.

Alternatively, the method further includes: locating a second position on the metal wire to be repaired, the second position being at a second side of the break point on the metal wire to be repaired; and outputting a second laser beam in such a manner as to move from the second position toward the break point and scan a portion of the metal wire between the second position and the break point, so as to fuse the portion of the metal wire and enable fused metal to flow toward the break point, thereby to fill the break point with the fused metal.

Alternatively, the method further includes, after the break point has been filled, coating a protective layer onto a portion of the metal wire exposed between the first position and the second position.

Alternatively, prior to locating the first position and the second position on the metal wire, the method further includes filling a gap in an insulating layer under the break point.

Alternatively, prior to filling the gap in the insulating layer under the break point, the method further includes removing the insulating layer under the break point, so as to enable the gap in the insulating layer to correspond to the break point.

Alternatively, the step of removing the insulating layer under the break point includes: locating a third position on the metal wire to be repaired, the third position being at the first side of the break point on the metal wire to be repaired and closer to the break point than the first position; outputting a third laser beam in such a manner as to move from the third position toward the break point and scan a portion of the metal wire between the third position and the break point as well as the insulating layer under the portion of the metal wire, so as to remove the portion of the metal wire and the insulating layer under the portion of the metal wire; locating a fourth position on the metal wire to be repaired, the fourth position being at the second side of the break point on the metal wire to be repaired and closer to the break point than the second position; and outputting a fourth laser beam in such a manner as to move from the fourth position toward the break point and scan a portion of the metal wire between the fourth position and the break point as well as the insulating layer under the portion of the metal wire, so as to remove the portion of the metal wire and the insulating layer under the portion of the metal wire.

Alternatively, the third position and/or the fourth position are at a periphery of the break point.

Alternatively, the scanning is performed several times using the first laser beam and the second laser beam.

In another aspect, the present disclosure provides in one embodiment a device for repairing a metal wire, including: a first laser beam output unit configured to output a first laser beam; a first location unit configured to locate a first position on the metal wire to be repaired, the first position being at a first side of a break point on the metal wire to be repaired; and a control unit configured to control the first laser beam output unit to output the first laser beam in such a manner as to move from the first position toward the break point, so as to fuse a portion of the metal wire between the first position and the break point and enable fused metal to flow toward the break point, thereby to fill the break point with the fused metal.

Alternatively, the device further includes a second laser beam output unit configured to output a second laser beam and a second location unit configured to locate a second position on the metal wire to be repaired, the second position being at a second side of the break point on the metal wire to be repaired. The control unit is further configured to control the second laser beam output unit to output the second laser beam in such a manner as to move from the second position toward the break point, so as to fuse a portion of the metal wire between the second position and the break point and enable fused metal to flow toward the break point, thereby to fill the break point with the fused metal.

Alternatively, the device further includes a coating unit configured to, after the break point has been filled, coat a protective layer onto a portion of the metal wire exposed between the first position and the second position.

Alternatively, each of the first location unit and the second location unit includes an image acquisition unit configured to acquire an image of the metal wire to be repaired, an image analyzing unit configured to determine a position of the break point on the metal wire to be repaired, and a location unit configured to locate the first position or the second position, and transmit information about the first position or the second position to the control unit.

According to the embodiments of the present disclosure, the metal in proximity to the break point on the metal wire to be repaired is fused with the laser beam, and when the metal wire is scanned by moving the laser beam from the first position toward the break point, the fused metal may flow from the first position toward the break point so as to repair the broken metal wire by means of the metal wire itself, without any need to use a dedicated repairing line. As a result, it is applicable to a terminal region of the display panel where no dedicated repairing line exists.

BRIEF DESCRIPTION OF THE DRAWINGS

FIG. 1b is an exploded view of the terminal region in FIG. 1a;

DETAILED DESCRIPTION

In order to make the objects, the technical solutions and the advantages more apparent, the present disclosure will be described hereinafter in conjunction with the drawings and embodiments.

The present disclosure provides in one embodiment a method for repairing a meal wire, which includes steps of: locating a first position on the metal wire to be repaired, the first position being at a first side of a break point on the metal wire to be repaired; and outputting a first laser beam in such a manner as to move from the first position toward the break point and scan a portion of the metal wire between the first position and the break point, so as to fuse the portion of the metal wire and enable fused metal to flow toward the break point, thereby to fill the break point with the fused metal.

According to the above-mentioned method in the embodiment of the present disclosure, the metal in proximity to the break point on the metal wire to be repaired is fused with the laser beam, and when the metal wire is scanned by moving the laser beam from the first position toward the break point, the fused metal may flow from the first position toward the break point so as to repair the broken metal wire by means of the metal wire itself, without any need to use a dedicated repairing line. As a result, it is applicable to a terminal region of a display panel where no dedicated repairing line exists.

The method will be described hereinafter by taking the repair of the metal wire at a terminal region of the display panel as an example.

In the first embodiment, the method includes scanning the metal wire from a side of the break point toward the break point using a laser beam, so as to fuse the metal at the side of the break point on the metal wire and enable the fused metal to flow toward the break point, thereby to fill the break point with the fused metal and connect the broken parts together, i.e., to complete the repair.

Figure 2A:
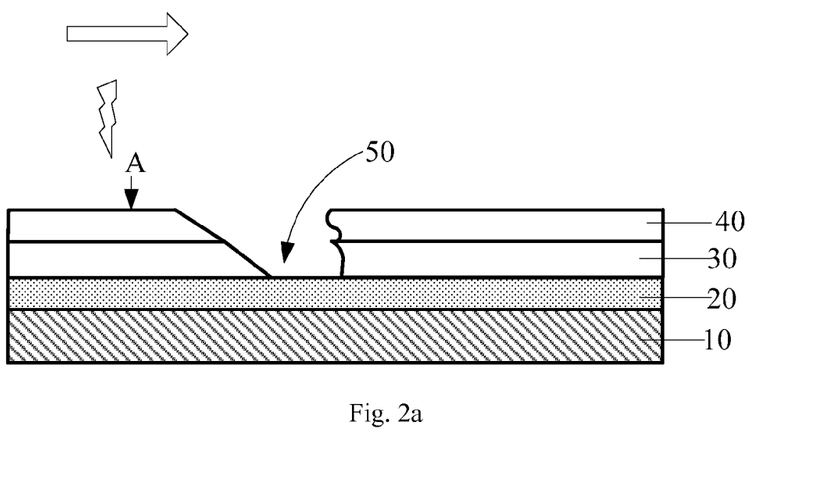
FIGS. 2a-2c are a flow chart of a method for repairing a metal wire according to the first embodiment of the present disclosure.

Referring to FIG. 2a, which is a sectional view of the terminal region of the display panel before the repair in the first embodiment, the terminal region includes, from bottom to top, a glass substrate 10, a first insulating layer 20, a metal wire layer 30 and a second insulating layer 40. When a broken circuit occurs at the terminal region, a break point 50 in FIG. 2a, which extends from the second insulating layer 40 to the metal wire layer 30, may occur.

The method in the first embodiment for repairing the break point 50 in FIG. 2a includes the following steps.

Step 1: as shown in FIG. 2a, locating a first position A on the metal wire where the break point 50 of the metal wire layer 30 is located, the first position A being at a side of the break point 50 (at a left side in FIG. 2a, and of course, it may also be at a right side).

Step 2: locating a first laser beam at the first position A, and controlling it to move from the first position A toward the break point 50, i.e., in a direction shown by the arrow in FIG. 2a, and to scan a portion of the meal wire between the first position A and the break point 50, so as to fuse the portion of the metal wire and enable, through a force generated during the scanning, fused metal to flow toward the break point 50, thereby to fill the break point 50 with the fused metal.

Figure 2B:
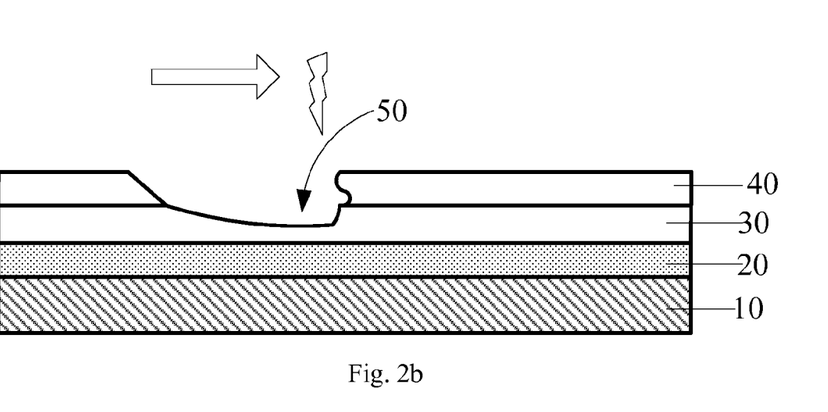

Step 3: when the fused metal in the break point 50 is insufficient to connect the broken parts of the metal wire after the scanning in Step 2, or when the broken parts of the metal wire are connected together but the metal in the break point 50 is of an insufficient thickness, repeating Step 2 until the broken parts are connected perfectly. Of course, when repeating Step 2, the scanning may be preformed from the first position A or not, as long as the fused metal is sufficient to fill the break point 50, as shown in FIG. 2b.

Figure 2C:
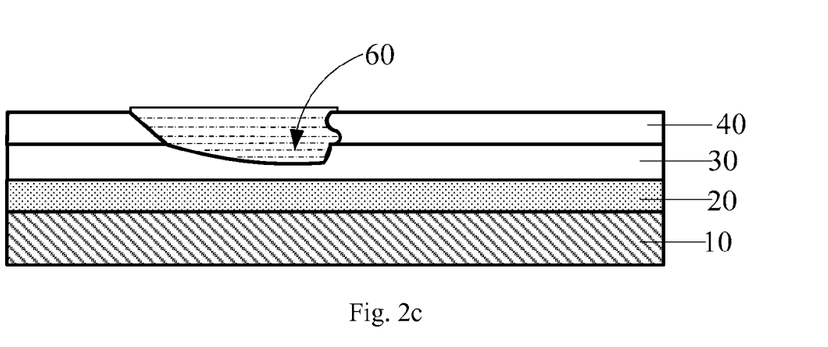

Step 4: coating, by a coating unit, a protective layer 60 onto the exposed metal wire after the repair, as shown in FIG. 2c. In this embodiment, when a position of each scanning step is located between the first position A and the break point 50, it is required to coat the protective layer 60 to the portion of the metal wire between the first position A and the rightmost edge of the break point 50, so that the protective layer 60 connects two disconnected parts of the second insulating layer 40.

In Steps 2 and 3, the first laser beam may be an infrared laser beam with a wavelength of 1065 nm, or a visible laser beam with a wavelength of 532 nm, or any other kind of laser beam. When the laser beams with different wavelengths are used to repair the metal wires made of different materials and having different widths and thicknesses, it is required to select the parameters of the laser beams, e.g., power and spot size. According to the method in the first embodiment, it is able to fuse the metal at the left side of the break point 50 by scanning the metal repeatedly with the laser beam and to enable the fused metal to flow toward the break point 50, thereby to successfully connect the broken parts of the metal wire with the metal in the break point 50 having a sufficient thickness, and to transmit an electric signal on the repair metal wire in an effective manner.

In addition, the first position A may be set in accordance with a size of the break point and parameters of the laser beam. The parameters of the laser beam as well as the distance between the first position A and the break point may be determined in accordance with the material and the thickness of the metal wire to be repaired, and the size of the break point.

Subsequent to Step 3, when the parameter of the laser beam is inappropriate and it is still impossible to effectively connect the broken parts of the metal wire after repeating Step 2, the method may further include: locating a second position on the metal wire to be repaired, the second position being at a second side of the break point on the metal wire to be repaired (when the first position A is located at the left side of the break point 50 in FIG. 2a, the second position is located at the right side of the break point 50); and outputting a second laser beam in such a manner as to move from the second position toward the break point and scan a portion of the metal wire between the second position and the break point, so as to fuse the portion of the metal wire and enable fused metal to flow toward the break point, thereby to fill the break point with the fused metal.

Through this additional step, the metal at the second side of the break point may be fused and flow toward the break point, so as to fill the break point and increase the amount of the metal in the break point, thereby to ensure the effective connection between the broken parts of the metal wire.

Figure 3A:
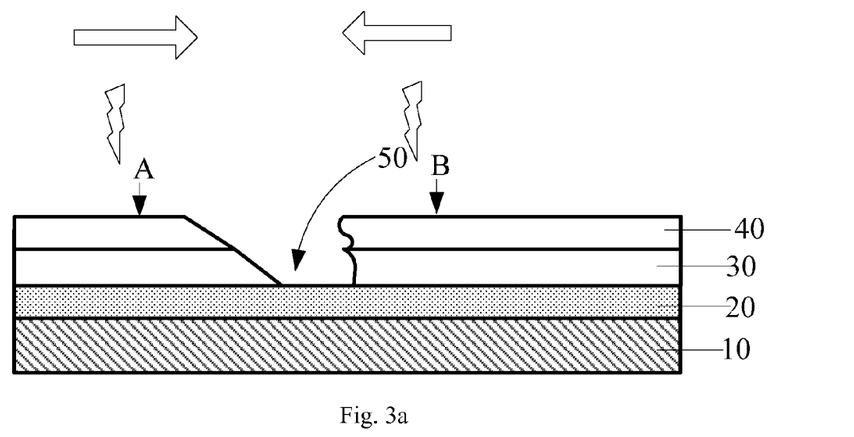
FIGS. 3a-3c are another flow chart of the method for repairing a metal wire according to the second embodiment of the present disclosure.

In the second embodiment, the method includes outputting two laser beams in such a manner as to scan the metal wire in two directions toward the break point, so as to fuse the metal at both sides of the break point on the metal wire and enable the metal to flow toward the break point, thereby to fill the break point with the fused metal Referring to FIG. 3a, which is a sectional view of the terminal region of the display panel before the repair, identical to the first embodiment, the terminal region in this embodiment includes, from bottom to top, the glass substrate 10, the first insulating layer 20, the metal wire layer 30 and the second insulating layer 40, and the break point 50 extends from the second insulating layer 40 to the metal wire layer 30.

The method in the second embodiment for repairing the break point 50 in FIG. 3a includes the following steps.

Step 1: as shown in FIG. 3a, locating a first position A on the metal wire where the break point 50 of the metal wire layer 30 is located, the first position A being at a first side of the break point 50 (at a left side in FIG. 3a), and locating a second position B on the metal wire where the break point 50 of the metal wire layer 30 is located, the second position B being at a second side of the break point 50 (at a right side in FIG. 3a).

Step 2: locating a first laser beam at the first position A, locating a second laser beam at the second position B, controlling the first laser beam to move from the first position A toward the break point 50 and controlling the second laser beam to move from the second position B toward the break point 50, i.e., in directions as shown by the arrows in FIG. 3a, and to scan portions of the meal wire between the first position A and the break point 50 and between the second position B and the break point 50, so as to fuse the portions of the metal wire and enable, through a force generated during the scanning, fused metal to flow toward the break point 50 in opposite directions, thereby to fill the break point 50 with the fused metal.

Figure 3B:
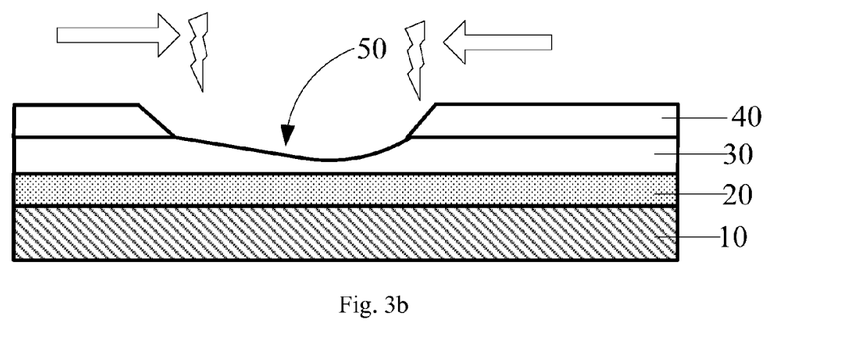

Step 3: when the fused metal in the break point 50 is insufficient to connect the broken parts of the metal wire after the scanning in Step 2, or when the broken parts of the metal wire are connected together but the metal in the break point 50 is of an insufficient thickness, repeating Step 2 until the broken parts are connected perfectly. Of course, when repeating Step 2, the scanning may be preformed from the first position A and the second position B or not, as long as the fused metal is sufficient to fill the break point 50, as shown in FIG. 3b.

Figure 3C:
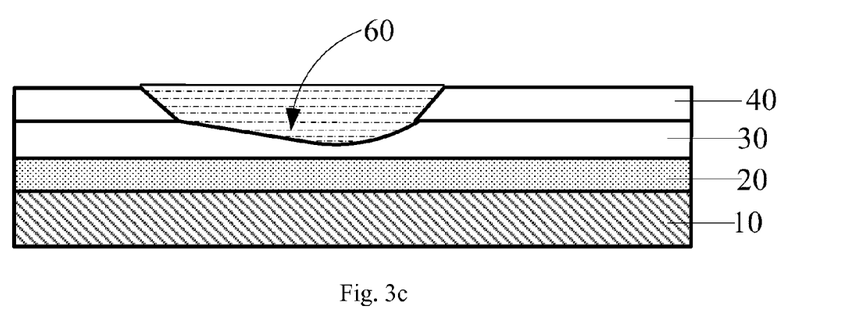

Step 4: coating, by a coating unit, the protective layer 60 onto the exposed metal wire after the repair, as shown in FIG. 3c. In this embodiment, when positions of each scanning step are located between the first position A and the break point 50 and between the second position B and the break point 50, respectively, it is required to coat the protective layer 60 to the portion of the metal wire between the first position A and the second position B, so that the protective layer 60 connects two disconnected parts of the second insulating layer 40.

In the second embodiment, the principles for determining the parameters of the first laser beam and the second beam and the principles for determining the first position A and the second position B are identical to those motioned in the first embodiment. In addition, it should be appreciated that, the scanning is performed by the two laser beams simultaneously in Step 2. However, the scanning from the first position A to the break point with the first laser beam and the scanning from the second position B to the break point with the second laser beam may not be performed simultaneously, or merely one laser head is provided to output the laser beam at both sides of the break point alternately.

In the first and second embodiments, the first insulating layer 20 under the metal wire layer 30 is complete, so it is merely required to repair the metal wire layer 30. The present disclosure further provides in the third embodiment the method which is applicable to the situation where the insulating layer under the metal wire layer is also damaged.

On the basis of the method in the second embodiment, the method for repairing the metal wire and the insulating layer under the metal wire simultaneously will be described hereinafter.

Referring to FIG. 4a, which is a schematic view showing the terminal region of the display panel before the repair, identical to the first and second embodiments of the present disclosure, the terminal region in the third embodiment includes, from bottom to top, the glass substrate 10, the first insulating layer 20, the metal wire layer 30 and the second insulating layer 40. However, different from the first and second embodiments, the break point 50 extends from the second insulating layer 40 to the first insulating layer 20, i.e., a gap also exits in the first insulating layer 20.

When repairing the metal wire in FIG. 4a, prior to fusing the metal wire with the laser beams and connecting the broken parts of the metal wire, it is required to fill the gap in the first insulating layer 20 under the break point 50. In order to control a process for filling the gap in a batched manner, alternatively, prior to filling the gap, it is required to remove the protective layer under the break point, so as to enable the gap in the protective layer to correspond to the break point.

The procedures of the method in the third embodiment will be described hereinafter in conjunction with the drawings.

The method for repairing the break point 50 in FIG. 4a may include the following steps.

Figure 4B:
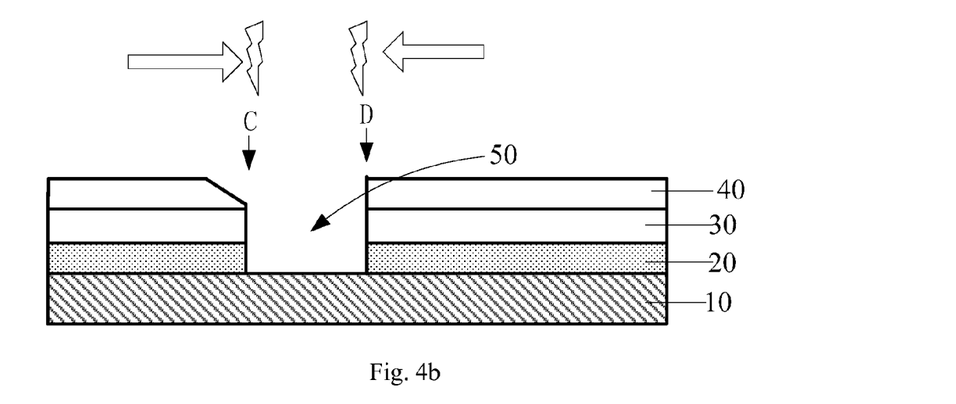

Step 1: as shown in FIG. 4b, locating a third position C on the metal wire, the third position C being at the first side of the break point 50 on the metal wire, i.e., at the left side of the break point 50 as shown in FIG. 4b, and outputting a third laser beam in such a manner as to move from the third position C toward the break point 50 and scan a portion of the metal wire between the third position C and the break point 50 as well as the first insulating layer 20 under the portion of the metal wire, so as to remove the portion of the metal wire and the insulating layer 20 under the portion of the metal wire.

Step 2: as shown in FIG. 4b, locating a fourth position D on the metal wire, the fourth position D being at the second side of the break point 50 on the metal wire, i.e., at the right side of the break point 50 as shown in FIG. 4b, and outputting a fourth laser beam in such a manner as to move from the fourth position D toward the break point 50 and scan a portion of the metal wire between the fourth position D and the break point as well as the first insulating layer under the portion of the metal wire, so as to remove the portion of the metal wire and the first insulating layer under the portion of the metal wire. In this way, the gap in the first insulating layer 20 corresponds to the shaped break point in the metal wire layer 30, i.e., they have an identical size. To be specific, the third position C and/or the fourth position D may be located at a periphery of the original break point 50 on the metal wire.

Figure 4C:
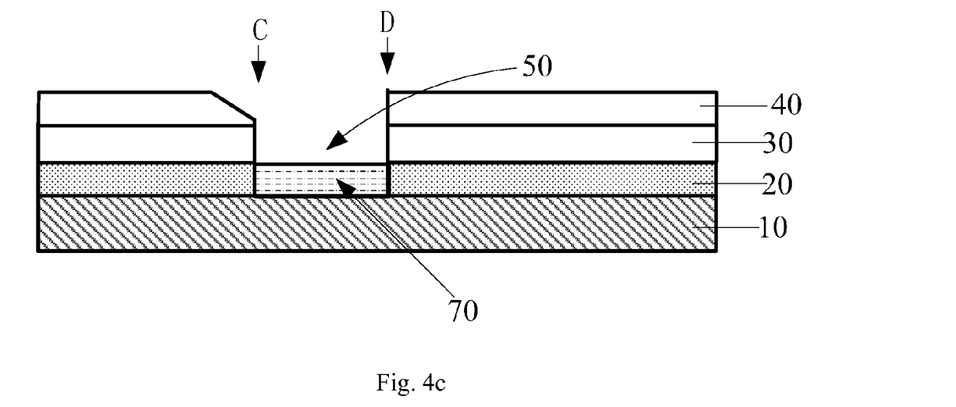

Step 3: as shown in FIG. 4c, coating, by a coating unit, a protective layer 70 at the shaped break point so as to fill the gap in the first insulating layer 20, the protective layer 70 having a thickness identical to the first insulating layer 20.

Figure 4D:
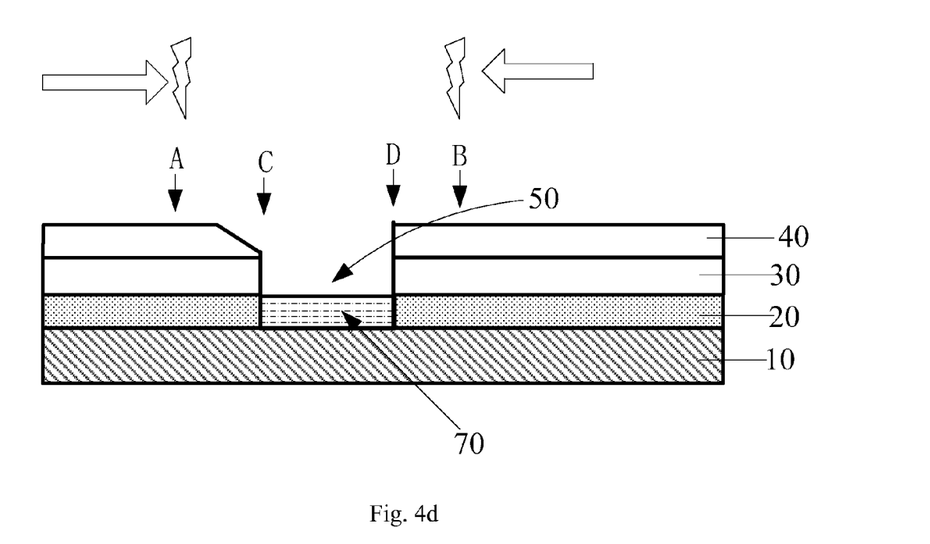

Step 4: as shown in FIG. 4d, locating a first position A on the metal wire where the break point 50 of the metal wire layer 30 is located, the first position A being located at the first side of the break point 50, e.g., at the left side of the break point 50 as show in FIG. 4d, and locating a second position B on the metal wire where the break point 50 of the metal wire layer 30 is located, the second position B being located at the second side of the break point 50, e.g., at the right side of the break point as shown in FIG. 4d. Usually, the first position A is further to the break point 50 than the third position C, and the second position B is further to the break point 50 than the fourth position D.

Step 5: locating a first laser beam at the first position A, locating a second laser beam at the second position B, controlling the first laser beam to move from the first position A toward the break point 50 and scan a portion of the metal wire between the first position A and the break point 50 and controlling the second laser beam to move from the second position B toward the break point 50 and scan a portion of the metal wire between the second position B and the break point 50, e.g., in directions as shown by the arrows in FIG. 4d, respectively, so as to fuse the portions of the metal wire and enable, through forces generated during the scanning, fused metal to flow toward the break point 50 in opposite directions, thereby to fill the break point 50 with the fused metal.

Figure 4E:
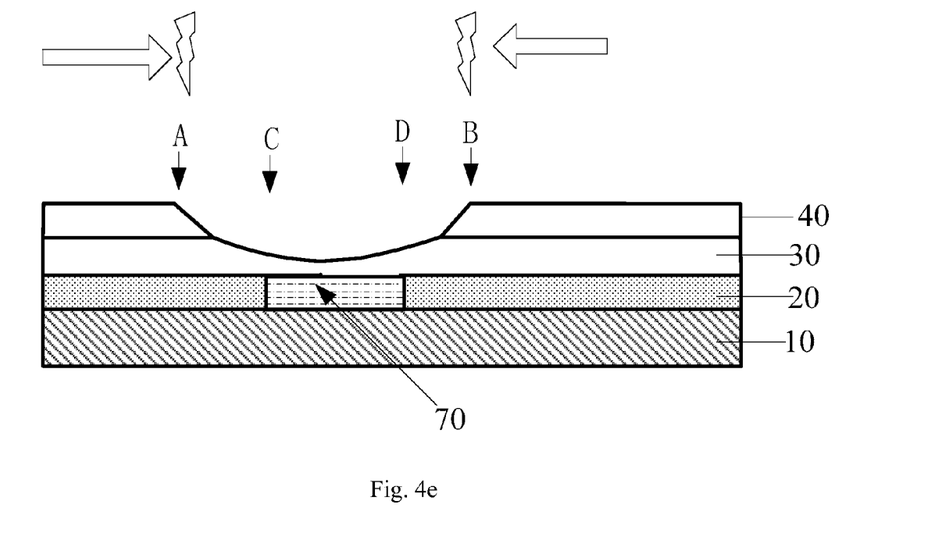

Step 6: when the fused metal in the break point 50 is insufficient to connect the broken parts of the metal wire after the scanning in Step 5, or when the broken parts of the metal wire are connected together but the metal in the break point 50 is of an insufficient thickness, repeating Step 5 until the broken parts are connected perfectly. Of course, when repeating Step 5, the scanning may be preformed from the first position A and the second position B or not, as long as the fused metal is sufficient to fill the break point 50, as shown in FIG. 4e.

Figure 4F:
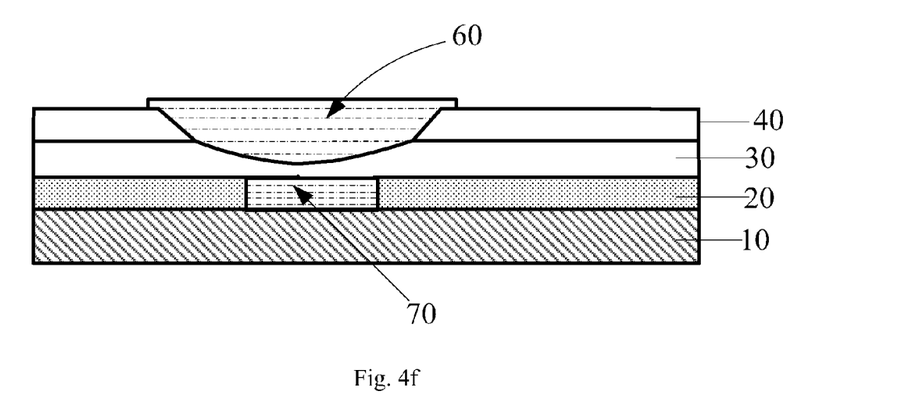

Step 7: coating, by a coating unit, a protective layer 60 onto the exposed metal wire after the repair, as shown in FIG. 4f. In the third embodiment, when positions of each scanning step are located between the first position A and the break point 50 and between the second position B and the break point 50, respectively, it is required to coat the protective layer 60 to the portion of the metal wire between the first position A and the second position B, so that the protective layer 60 connects two disconnected parts of the second insulating layer 40.

In the third embodiment, the principles for determining the parameters of the first laser beam and the second beam and the principles for determining the first position A and the second position B are identical to those motioned in the first embodiment.

Of course, it should be appreciated that, in Steps 4 through 6, the mode of scanning with two laser beams may be replaced with the mode of scanning with one laser beam mentioned in the first embodiment.

On the basis of the above method, the present disclosure further provides in one embodiment a device for repairing a metal wire, which includes a first laser beam output unit configured to output a first laser beam; a first location unit configured to locate a first position on the metal wire to be repaired, the first position being at a first side of a break point on the metal wire to be repaired; and a control unit configured to control the first laser beam output unit to output the first laser beam in such a manner as to move from the first position toward the break point, so as to fuse a portion of the metal wire between the first position and the break point and enable fused metal to flow toward the break point, thereby to fill the break point with the fused metal.

According to the above-mentioned device, the control unit controls the first laser beam from the first laser beam output unit to move from the first position toward the break point and scan the metal wire, so as to fuse the metal between the first position and the break point and enable the fused metal to flow from the first position toward the break point, thereby to repair the broken metal wire by means of the metal wire itself, without any need to use a dedicated repairing line. As a result, it is applicable to a terminal region of the display panel where no dedicated repairing line exists.

Alternatively, the device further includes a second laser beam output unit configured to output a second laser beam and a second location unit configured to locate a second position on the metal wire to be repaired, the second position being at a second side of the break point on the metal wire to be repaired. The control unit is further configured to control the second laser beam output unit to output the second laser beam in such a manner as to move from the second position toward the break point, so as to fuse a portion of the metal wire between the second position and the break point and enable fused metal to flow toward the break point, thereby to fill the break point with the fused metal.

Through the combination of the first laser beam output unit and the second laser beam output unit, it is able to output two laser beams, so as to scan the metal wire in opposite directions, fuse the metal at both sides of the break point on the metal wire, respectively, and enable the fused metal to flow ward the break point in opposite directions, thereby to fill the break point with the fused metal and connect the broken parts, i.e., to repair the broken metal wire.

To be specific, both of the first laser beam output unit and the second laser beam output unit may be provided, or merely one of them may be provided. When there is merely one laser beam output unit, it may be used to output the laser beam at both sides of the break point and scan the portions of the metal wire alternately.

Alternatively, the device may further include a coating unit configured to, after the break point has been filled, coat a protective layer onto a portion of the metal wire exposed between the first position and the second position.

To be specific, each of the first location unit and the second location unit includes an image acquisition unit configured to acquire an image of the metal wire to be repaired, an image analyzing unit configured to determine a position of the break point on the metal wire to be repaired, and a location unit configured to locate the first position or the second position, and transmit information about the first position or the second position to the control unit.

The image acquisition unit and the image analyzing unit may be integrated into a high-rate camera. The image acquisition unit may acquire the image of the metal wire at the terminal region, and the image analyzing unit may detect whether or not the metal wire at the terminal region is defective (e.g., by comparing the acquired image with a standard image, or comparing brightness levels, darkness levels or grayscale levels) and determine whether or not there is a break point. When it is determined that the metal wire is broken, a position of the break point is recorded and transmitted to the control unit for locating the laser beam output unit and the coating unit to the break point.

Figure 5:
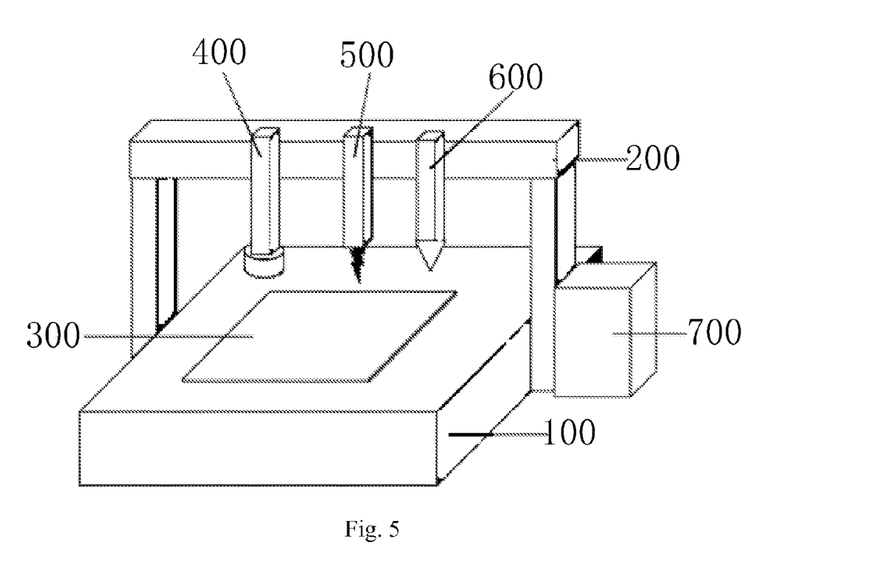
FIG. 5 is a schematic view showing a device for repairing a metal wire according to one embodiment of the present disclosure.

Referring to FIG. 5, which is a schematic view of the device according to one embodiment of the present disclosure, the device further includes an immobile platform 100 on which a display panel 300 to be detected is placed, and a movable bracket 200 which is reciprocable in a direction relative to the platform 100. A high-rate camera 400, a laser beam output unit 500 and a coating unit 600 are arranged on the bracket 300 and right above the display panel 300 to be detected, and a control unit 700 is arranged fixedly at a side of the bracket 200.

The high-rate camera 400 is used to detect the metal wire at the terminal region of the display panel, and determine the position of the break point, so as to enable the control unit 700 to locate the laser beam from the laser beam output unit 500 toward the metal wire in accordance with the position of the break point. The laser beam output unit 500 outputs the laser beam so as to fuse the portion of the metal wire. The control unit 700 locates the laser beam from the laser beam output unit 500 to a starting position, controls the laser beam to scan the portion of the metal wire between the starting position and the break point, and control the coating unit 600 to coat the protective layer.

Of course, the structure of the device is not limited to the above, and instead, various alterations may be made, which will not be particularly defined herein.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. A method for repairing a metal wire, comprising:
   locating a first position on the metal wire to be repaired, the first position being at a first side of a break point on the metal wire to be repaired; and
   fusing a portion of the metal wire between the first position and the break point by scanning the portion of the metal wire between the first position and the break point with a first laser beam to cause fused metal of the portion of the metal wire between the first position and the break point to flow towards the break point and fill the break point.

2. The method according to claim 1, further comprising:
   locating a second position on the metal wire to be repaired, the second position being at a second side of the break point on the metal wire to be repaired; and
   outputting a second laser beam in such a manner as to move along a direction from the second position toward the break point and scan a portion of the metal wire between the second position and the break point, so as to fuse the portion of the metal wire between the second position and the break point and enable fused metal to flow toward the break point to fill the break point.

3. The method according to claim 2, further comprising:
   after the break point has been filled, coating a protective layer onto a portion of the metal wire exposed between the first position and the second position.

4. The method according to claim 2, wherein before locating the first position and the second position on the metal wire, the method further comprises: filling a gap in an insulating layer under the break point.

5. The method according to claim 4, wherein before filling the gap in the insulating layer under the break point, the method further comprises: removing a portion of the insulating layer under the break point, so as to enable the gap in the insulating layer to correspond to the break point.

6. The method according to claim 5, wherein the step of removing the portion of the insulating layer under the break point comprises:
   locating a third position on the metal wire to be repaired, the third position being at the first side of the break point on the metal wire to be repaired and closer to the break point than the first position;
   outputting a third laser beam in such a manner as to move along a direction from the third position toward the break point and scan a portion of the metal wire between the third position and the break point as well as the portion of the insulating layer under the portion of the metal wire between the third position and the break point, so as to remove the portion of the metal wire between the third position and the break point and the portion of the insulating layer under the portion of the metal wire between the third position and the break point;

locating a fourth position on the metal wire to be repaired, the fourth position being at the second side of the break point on the metal wire to be repaired and closer to the break point than the second position; and outputting a fourth laser beam in such a manner as to move along a direction from the fourth position toward the break point and scan a portion of the metal wire between the fourth position and the break point as well as a portion of the insulating layer under the portion of the metal wire between the fourth position and the break point, so as to remove the portion of the metal wire between the fourth position and the break point and the insulating layer under the portion of the metal wire between the fourth position and the break point.

7. The method according to claim 6, wherein the third position and/or the fourth position are at a periphery of the break point.

8. The method according to claim 2, wherein each of the first laser beam and the second laser beam scans for several times.

9. A device for repairing a metal wire, comprising:
a first laser beam output unit configured to output a first laser beam;
a first location unit configured to locate a first position on the metal wire to be repaired, the first position being at a first side of a break point on the metal wire to be repaired; and
a control unit configured to control the first laser beam output unit to output the first laser beam in such a manner as to move along a direction from the first position toward the break point, so as to fuse a portion of the metal wire between the first position and the break point and enable fused metal to flow toward the break point to fill the break point;
a second laser beam output unit configured to output a second laser beam; and
a second location unit configured to locate a second position on the metal wire to be repaired, the second position being at a second side of the break point on the metal wire to be repaired,
wherein the control unit is further configured to control the second laser beam output unit to output the second laser beam in such a manner as to move along a direction from the second position toward the break point, so as to fuse a portion of the metal wire between the second position and the break point and enable fused metal to flow toward the break point to fill the break point.

10. The device according to claim 9, further comprising:
a coating unit configured to, after the break point has been filled, coat a protective layer onto a portion of the metal wire exposed between the first position and the second position.

11. The device according to claim 9, wherein each of the first location unit and the second location unit comprises: an image acquisition unit configured to acquire an image of the metal wire to be repaired;

an image analyzing unit configured to determine a position of the break point on the metal wire to be repaired; and
a location unit configured to locate the first position or the second position, and transmit information of the first position or the second position to the control unit.

12. A method for repairing a metal wire, comprising:
locating a first position on the metal wire to be repaired, the first position being at a first side of a break point on the metal wire to be repaired; and
outputting a first laser beam in such a manner as to move along a direction from the first position toward the break point and scan a portion of the metal wire between the first position and the break point, so as to fuse the portion of the metal wire between the first position and the break point and enable fused metal to flow toward the break point to fill the break point;
locating a second position on the metal wire to be repaired, the second position being at a second side of the break point on the metal wire to be repaired; and
outputting a second laser beam in such a manner as to move along a direction from the second position toward the break point and scan a portion of the metal wire between the second position and the break point, so as to fuse the portion of the metal wire between the second position and the break point and enable fused metal to flow toward the break point to fill the break point.

13. The method according to claim 12, further comprising:
after the break point has been filled, coating a protective layer onto a portion of the metal wire exposed between the first position and the second position.

14. The method according to claim 12, wherein before locating the first position and the second position on the metal wire, the method further comprises: filling a gap in an insulating layer under the break point.

15. The method according to claim 14, wherein before filling the gap in the insulating layer under the break point, the method further comprises: removing a portion of the insulating layer under the break point, so as to enable the gap in the insulating layer to correspond to the break point.

16. The method according to claim 15, wherein the step of removing the portion of the insulating layer under the break point comprises:
locating a third position on the metal wire to be repaired, the third position being at the first side of the break point on the metal wire to be repaired and closer to the break point than the first position;
outputting a third laser beam in such a manner as to move along a direction from the third position toward the break point and scan a portion of the metal wire between the third position and the break point as well as the portion of the insulating layer under the portion of the metal wire between the third position and the break point, so as to remove the portion of the metal wire between the third position and the break point and the portion of the insulating layer under the portion of the metal wire between the third position and the break point;
locating a fourth position on the metal wire to be repaired, the fourth position being at the second side of the break point on the metal wire to be repaired and closer to the break point than the second position; and
outputting a fourth laser beam in such a manner as to move along a direction from the fourth position toward the break point and scan a portion of the metal wire between the fourth position and the break point as well as a portion of the insulating layer under the portion of the metal wire between the fourth position and the break point, so as to remove the portion of the metal wire between the fourth position and the break point and the insulating layer under the portion of the metal wire between the fourth position and the break point.

17. The method according to claim 16, wherein the third position and/or the fourth position are at a periphery of the break point.

18. The method according to claim 12, wherein each of the first laser beam and the second laser beam scans for several times.

* * * * *